(12) United States Patent
Pascucci

(10) Patent No.: US 6,882,001 B2
(45) Date of Patent: Apr. 19, 2005

(54) ELECTRICALLY-PROGRAMMABLE NON-VOLATILE MEMORY CELL

(75) Inventor: Luigi Pascucci, Sesto San Giovanni (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/372,044

(22) Filed: Feb. 20, 2003

(65) Prior Publication Data

US 2003/0197217 A1 Oct. 23, 2003

(30) Foreign Application Priority Data

Feb. 20, 2002 (EP) ............................................. 02425085

(51) Int. Cl.[7] .......................................... H01L 29/788
(52) U.S. Cl. ...................... 257/315; 257/316; 257/322; 257/324; 257/325; 257/326; 438/201; 438/211; 438/216; 438/257; 438/261; 438/266
(58) Field of Search ................................ 257/315, 316, 257/322, 324, 325, 326; 438/201, 211, 216, 257, 261, 266

(56) References Cited

U.S. PATENT DOCUMENTS

| | | | |
|---|---|---|---|
| 4,586,065 A | | 4/1986 | Neukomm |
| 5,604,366 A | * | 2/1997 | Lee ............................ 257/316 |
| 5,739,568 A | | 4/1998 | Kojima |
| 5,828,099 A | * | 10/1998 | Van Dort et al. ............ 257/314 |
| 5,844,271 A | * | 12/1998 | Sethi et al. .................. 257/318 |
| 5,889,700 A | * | 3/1999 | Bergemont et al. ..... 365/185.18 |
| 5,894,162 A | * | 4/1999 | Paterson et al. ............. 257/316 |
| 6,078,075 A | * | 6/2000 | Widdershoven .............. 257/321 |
| 6,242,773 B1 | * | 6/2001 | Thomas ....................... 257/315 |
| 6,243,300 B1 | | 6/2001 | Sunkavalli |
| 6,734,491 B1 | * | 5/2004 | Mitros et al. ................ 257/315 |

FOREIGN PATENT DOCUMENTS

EP 0 778581 6/1997

OTHER PUBLICATIONS

European Search Report for EP 02 42 5085, Aug. 6, 2002.

* cited by examiner

Primary Examiner—Nathan J. Flynn
Assistant Examiner—Remmon R. Fordé
(74) Attorney, Agent, or Firm—Lisa K. Jorgenson; Bryan A. Santarelli; Graybeal Jackson Haley LLP

(57) ABSTRACT

An electrically-programmable memory cell programmed by means of injection of channel hot electrons into a charge-storage element capacitively coupled to a memory cell channel for modulating a conductivity thereof depending on a stored amount of charge. A first and a second spaced-apart electrode regions are formed in a semiconductor layer and define a channel region there between; at least one of the first and second electrode regions acts as a programming electrode of the memory cell. A control electrode is capacitively coupled to the charge-storage element. The charge-storage element is placed over the channel to substantially extend from the first to the second electrode regions, and is separated from the channel region by a dielectric layer. The dielectric layer has a reduced thickness in a portion thereof near the at least one programming electrode.

23 Claims, 4 Drawing Sheets

FIG. 2

ELECTRICALLY-PROGRAMMABLE NON-VOLATILE MEMORY CELL

PRIORITY CLAIM

This application claims priority from European patent application No. 02425085.4, filed Feb. 20, 2002, which is incorporated herein by reference.

TECHNICAL FIELD

The present invention relates generally to the field of semiconductor memories, particularly to non-volatile memories and even more particularly to electrically programmable non-volatile memories. Specifically, the invention concerns a memory cell of the type programmable by injection of channel hot electrons into a charge-storage element.

BACKGROUND

The storage of information in electrically-programmable non-volatile memory cells such as EPROMs and Flash EEPROMs relies on the possibility of having an electric charge trapped in a charge-storage element. The presence of an electric charge in the charge-storage element determines a change in the memory cell threshold voltage. The threshold voltage change can be assessed by measuring a current sunk by the memory cell in a prescribed bias condition.

Typically, the charge storage element is constituted by a polysilicon floating gate insulatively placed over the memory cell channel region and capacitively coupled to a polysilicon control gate. Charge carriers are injected into the floating gate by means of injection of channel hot electrons. The presence of an electric charge in the floating gate affects the formation of a conductive channel in the channel region.

Up to some years ago, each memory cell was used to store one bit, corresponding to the absence (a condition conventionally interpreted as a logic "1") or the presence (conventionally a logic "0") in the floating gate of an electric charge equal to or greater than a prescribed minimum amount.

The constant trend towards the increase of memory storage capacity per unit chip area has however suggested that each memory cell could be used to store more than one bit.

Memory cells have therefore been proposed whose threshold voltage can take one of a plurality of threshold voltage levels. In such memory cells, commonly referred to as multi-level, the amount of charge trapped in the floating gate is precisely controlled and can take more than two values, for example four. A different threshold voltage corresponds to each value of electric charge. For example, a four-level memory cell is able to store two bits.

More recently, memory cells having two charge-storage locations have been proposed. In these memory cells it is possible to have an electric charge trapped in two physically distinct memory cell locations, normally at each side of the channel region, near the memory cell source/drain regions. These memory cells are therefore intrinsically adapted to store two bits.

Two types of dual charge-storage location memory cells are known in the art.

A first type of dual charge-storage location memory cell is described for example in U.S. Pat. No. 5,949,711. The memory cell comprises a polysilicon control gate insulatively placed over a channel region. At both sides of the control gate, near the source/drain regions, two electrically-isolated spacer-like polysilicon elements form two floating gates.

Charge can be selectively injected into each floating gate and be trapped therein. Each floating gate controls a short portion of the memory cell channel.

Each one of the source/drain regions acts as a source electrode when reading the value of the charge trapped in the adjacent floating gate, and as a drain electrode when reading the value of the charge trapped in the opposite floating gate.

As the traditional single-bit or multi-level memory cells having a single floating gate, this dual charge-storage location memory cell relies for its operation on the capacitive coupling between the control gate and the two, floating gates.

However, because the two floating gates are located at the sides of the control gate, the coupling areas between the control gate and the floating gates are rather small. The capacitive coupling is therefore small, thus allowing only a small amount of charge to be injected. Additionally, from a practical viewpoint it is difficult to form the two spacer-like polysilicon floating gates at the sides of the control gate.

A second type of dual charge-storage location memory cell is described for example in U.S. Pat. No. 6,011,725. The memory cell comprises a polysilicon conductive gate insulatively placed over a channel region with interposition of an oxide-nitride-oxide (ONO) stack of layers, in which the nitride layer acts as a charge-trapping layer. Charge can be injected into and trapped in two separated and separately chargeable areas within the nitride layer, near the memory cell source/drain regions which, as in the first type of dual charge-storage location memory cell described above, change their role of source/drain electrodes while reading the charge trapped in one or the other of the two chargeable areas.

Compared to the first type previously described, this dual charge-storage location memory cell requires one less polysilicon layer, which simplifies the manufacturing process thereof and ensures a better reproducibility, thanks to the fact that the memory cell is highly planar. However, this structure is affected by a number of other problems, some of which will now be discussed.

In principle, the charge injected into the nitride layer should remain localized at the two edge portions thereof, near the charge injection regions (i.e., near the source/drain regions). The localization of the injected charge is indispensable for the memory cell to be capable of storing two bits. However, for several reasons the distribution of the charges injected into the nitride layer departs from the ideal one.

For example, during the memory cell programming phase, the electric field, which initially (i.e., when no charges have yet been injected into the nitride layer) is favorable to the injection of charges at the edges of the nitride layer, progressively changes due to the very presence in the nitride layer of already-injected charges, which have a screening effect. Consequently, the electric field progressively favors the injection and trapping of charges at the centre of the nitride layer. The charges injected into one of the two chargeable areas of the nitride layer to program one of the two memory cell bits may even propagate to reach the opposite chargeable area, thus inducing a spurious programming of the other bit.

Additionally, during the programming phase a secondary mechanism known as CHISEL causes charges to be injected into the central portion of the nitride layer. This contributes to decreasing the localization of the injected charges. The CHISEL mechanism is enhanced by the unavoidable presence, in series to the source/drain regions, of parasitic resistances, which alter the memory cell effective biasing conditions. It is to be observed that normally the CHISEL mechanism is purposely exploited to limit the current consumption in programming, an important feature for memory devices which have to support a high degree of parallelism in programming, such as the memory devices for mass storage memory cards, and a real must in all those memory devices designed to operate with a Single Power Supply ("SPS"). Thus, in order to try and keep the injected charge localized, the otherwise beneficial CHISEL effect should be somehow inhibited, with a negative impact on the current consumption in programming. As a consequence, the degree of parallelism in programming has to be strongly limited, especially in SPS memory devices.

Also, phenomena of local saturation and charge redistribution effects within the nitride layer tend to reduce the localization of the charges injected into one of the two chargeable areas of the nitride layer, with a consequent spread of charges towards the central portion of the nitride layer and even towards the opposite chargeable area.

As a consequence the charges injected into one of the two chargeable areas, instead of being localized at that chargeable area, progressively tend to be delocalized in the central portion of the nitride layer, over the central portion of the memory cell channel region, and in the opposite chargeable area.

In general, these charges affect the operation of the memory cell, by modifying the threshold voltage thereof in an uncontrolled manner. The redistribution of the charges injected into one edge of the nitride layer towards the central portion and towards the opposite edge thereof may also cause a loss of the stored information.

The repetition of write/erase cycles exacerbates these charge redistribution effects. The distributions of threshold voltages corresponding to a programmed and to an erased bit tend therefore to spread. As a consequence, the threshold voltage shift, which the memory cell has to undergo for programming one bit, must be relatively high. This has the negative consequence of accelerating the memory cell aging, because the effects of redistribution of the injected charges are more pronounced the higher the amount of injected electric charges. The more charges are injected into one edge of the nitride layer, the more charges tend to be located at the central portion and at the opposite edge of the nitride layer, the more difficult is to remove the charges during the erase operation, the wider the distributions of threshold voltages. Another drawback of submitting the memory cell to a high threshold voltage shift is the need of applying to the memory cell drain region a relatively high potential for a relatively long period of time: this has a soft-erase effect on the memory cells belonging to the same column of the memory cell array as the memory cell under programming.

Additionally, the poor control of the amount of charges trapped in the useful positions of the nitride layer, together with the need of having a high threshold voltage shift for making a programmed bit distinguishable from an erased one, prevents from trying to increase the storage capacity by adopting a multi-level approach. Even worse, due to their position, the charges located in the central portion of the nitride layer are hardly removed during the memory cell-erasing phase. This means that the amount of charges trapped in the central portion of the nitride layer tends to rapidly increase with the number of program/erase cycles to which the memory cell is submitted. This causes a rapid increase of the time needed to erase the memory cell, up to a condition such that the memory cell cannot be erased any more.

It is to be observed that the above problems become more serious the smaller the memory cell dimensions, and therefore pose a limitation to the memory cell shrinkage.

SUMMARY

In view of the state of the art described, an embodiment of the present invention provides a memory cell which is not affected by the problems discussed above.

In brief, the memory cell comprises a first and a second spaced-apart electrode regions formed in a semiconductor layer and defining a channel region there between. At least one of the first and second electrode regions acts as a programming electrode of the memory cell.

A charge-storage element is placed over the channel region to substantially extend from the first to the second electrode regions; a dielectric layer is interposed between the charge-storage element and the channel region, and a control electrode is capacitively coupled to the charge-trapping layer.

The dielectric layer has a reduced thickness in a portion thereof near the at least one programming electrode.

Another embodiment of the present invention provides a process for fabricating an electrically programmable non-volatile memory cell.

Summarizing, this process comprises:

forming a first and a second spaced-apart electrode regions in a semiconductor layer, the first and second electrode regions defining a channel region there between, at least one of the first and second electrode regions designed to act as a programming electrode of the memory, cell;

placing a charge-storage layer over the channel region with interposition of a dielectric layer, the charge-storage layer substantially extending from the first to the second electrode regions;

forming a control electrode capacitively coupled to the charge-storage layer.

The dielectric layer is formed with a reduced thickness in a portion thereof near the at least one programming electrode.

BRIEF DESCRIPTION OF THE DRAWINGS

The features and advantages of the: present invention will be made apparent by the following detailed description of some embodiments thereof, provided merely by way of non-limitative examples with reference to the attached drawings, wherein.

DETAILED DESCRIPTION

With reference to the drawings, FIGS. 1A to 1E are cross-sectional views showing the main steps of a fabrication process of a dual charge-storage location memory cell according to an embodiment of the present invention.

Figure 1A:
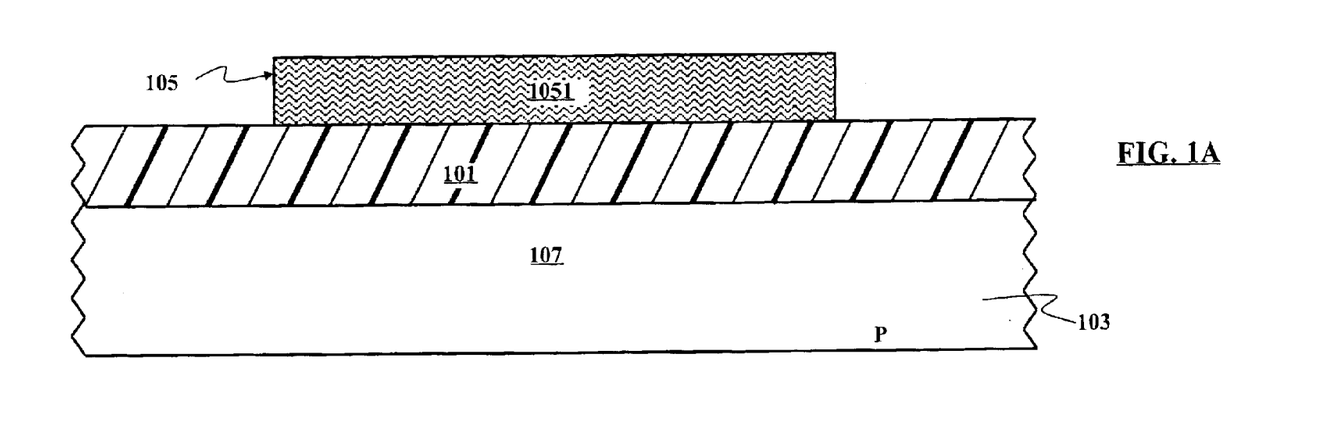
FIGS. 1A to 1E are cross-sectional views showing the main steps of a fabrication process of an electrically programmable memory cell according to a first embodiment of the present invention, particularly a dual charge-storage location memory cell.

Referring to FIG. 1A, a silicon dioxide (SiO$_2$) layer 101 is formed on a surface of a semiconductor layer 103, for example of the P conductivity type with a doping level ranging from $10^{15}$ to $10^{18}$ atoms/cm$^3$. The silicon dioxide layer 101 is preferably rather thick, having for example a thickness of the order of $10^3$ Angstroms. The silicon dioxide layer 101 can be formed by thermal oxidation or by chemical vapor deposition (CVD). The semiconductor layer 103 can be the substrate of a semiconductor wafer, or a doped semiconductor well formed in the wafer substrate.

A photoresist layer 105 is deposited over the silicon dioxide layer 101; according to conventional photolithographic techniques, the photoresist layer 105 is exposed to a suitable radiation source (e.g., UV rays) through a mask (not shown), then the photoresist layer is developed and selectively removed. A portion 1051 of the photoresist layer 105 is left on the silicon dioxide layer 101 over a region 107 of the semiconductor layer 103 intended to become a channel region of the memory cell.

The silicon dioxide layer 101 is then selectively removed from over the semiconductor layer 103, by means of a selective etch process. The photoresist layer portion 1051 acts as an etch mask for the underlying silicon dioxide layer 101, preventing it from being removed. A portion 1011 of the silicon dioxide layer 101 is thus left over the region 107 of the semiconductor layer 103 (FIG. 1B).

Figure 1B:
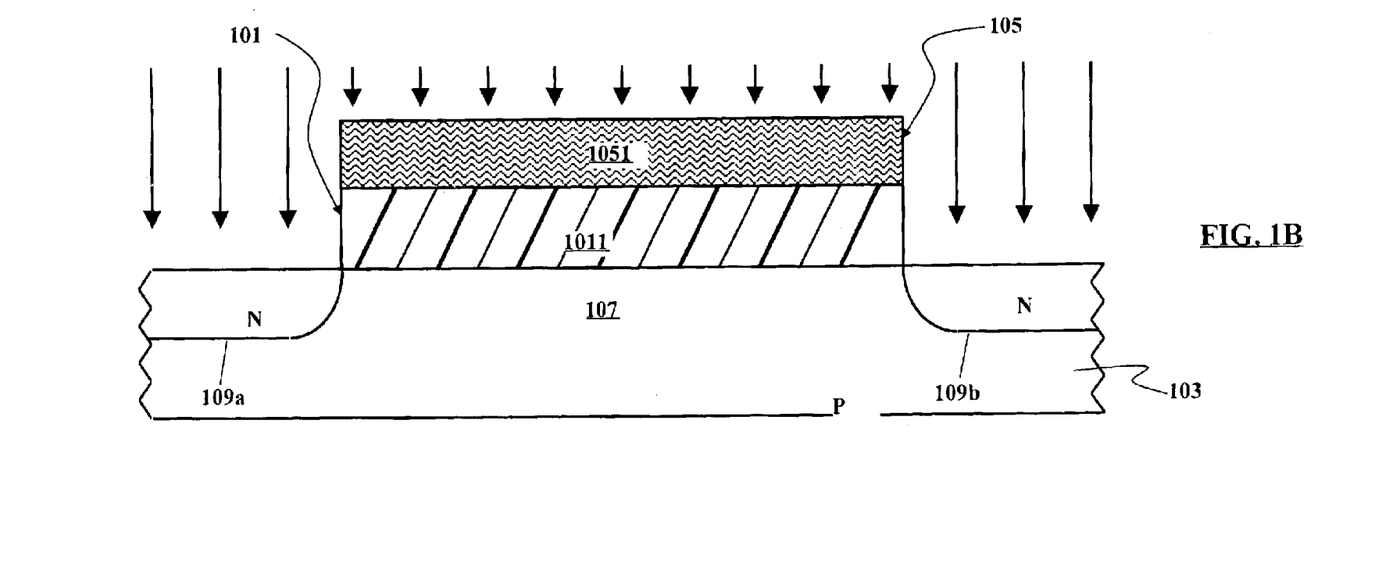

An N-type dopant is then introduced into the semiconductor layer 103 at the sides of the region 107, so as to form source/drain regions 109a, 109b of the memory cells (FIG. 1B). For example, arsenic ions are implanted into the semiconductor layer 103 in a dose of the order of $10^{15}$ atoms/cm$^2$. The source/drain regions 109a, 109b result aligned with the edges of the silicon dioxide layer portion 1011.

The photoresist layer 105 is then removed. The silicon dioxide layer portion 1011 is subjected to an isotropic etch, for example a wet etching, causing a substantial reduction of the thickness thereof. After the isotropic etch, a silicon dioxide film 1012 of, e.g., 50 to 90 Å is left over the semiconductor layer 103. The etch rate is higher at the sides of the silicon dioxide layer portion 1011 than at the centre thereof, because the silicon dioxide layer portion 1011 is etched from more directions at the side than at the centre. The isotropic etch thus causes not only a thinning, but also a reduction of the lateral extension of the silicon dioxide layer portion 1011, thereby the remaining silicon dioxide film 1012 is spaced apart from the source/drain regions 109a, 109b.

Figure 1C:
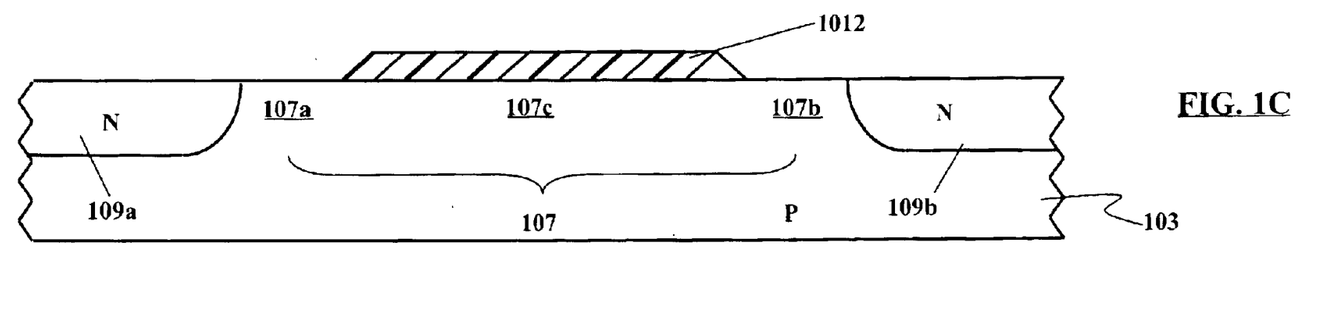

Three sub-regions 107a, 107b and 107c can thus be identified in the semiconductor layer region 107: two sub-regions 107a and 107b extend from the edge of the source/drain regions 109a and 109b, respectively, to the edge of the silicon dioxide film 1012, and a sub-region 107c is located under the silicon dioxide film 1012 (FIG. 1C).

Figure 1D:
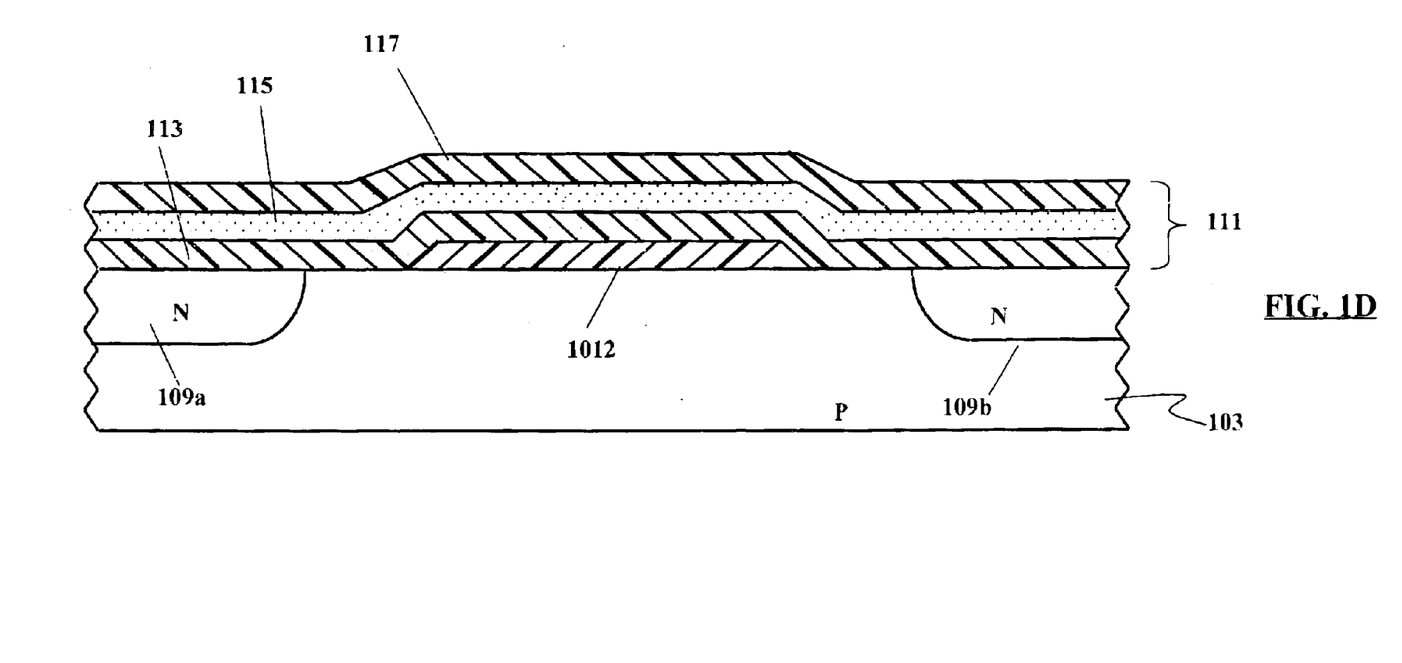

A stack 111 of three layers is then formed on the top surface of the structure. The stack of layers 111 comprises a bottom layer 113 of silicon dioxide, an intermediate layer 115 of silicon nitride and a top layer 117 of silicon dioxide. The oxide-nitride-oxide (ONO) stack of layers 111 can be formed by thermal growth or CVD, and has for example an overall thickness of 90 to 100 Å. The nitride layer 115 will form the charge-storage element of the memory cell (FIG. 1D).

Figures 1E, 3:
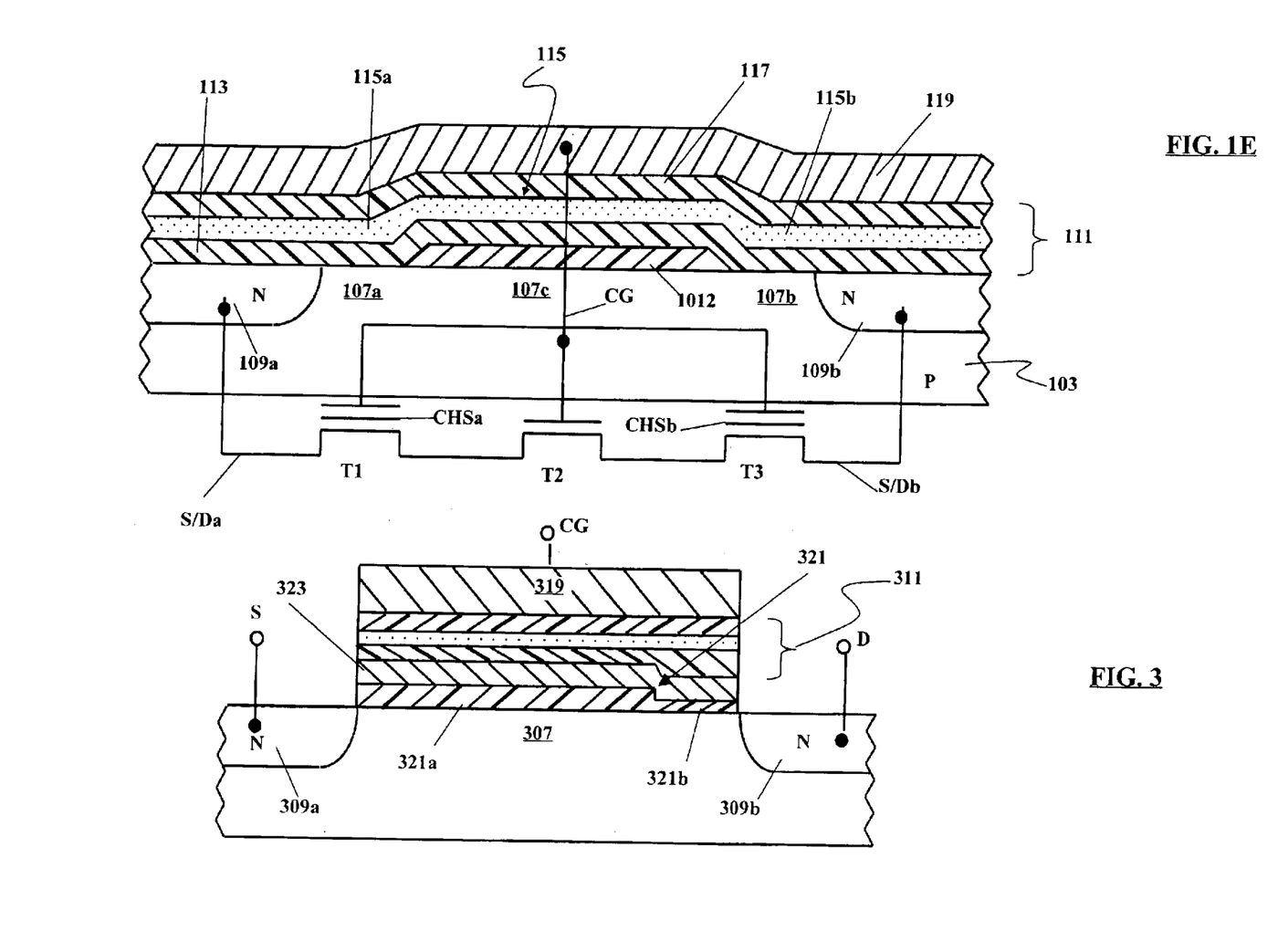
FIG. 3 is a cross-sectional view of an electrically-programmable memory cell according to another embodiment of the present invention.

A layer of polysilicon 119 is then formed over the ONO stack 11 (FIG. 1E). The polysilicon layer 119 is preferably doped to increase the conductivity thereof. Optionally, a layer of titanium or tungsten silicide is formed on the polysilicon layer, for further increasing the conductivity.

As schematically depicted in FIG. 1E, the memory cell is functionally equivalent to three MOS transistors T1, T2, T3 connected in series between the two source/drain regions 109a, 109b.

The lateral transistors T1 and T3, represented in the drawing by the symbol of a stacked-gate MOS transistor, are each one adjacent a respective source/drain region 109a, 109b, and have each a control gate, formed by the polysilicon layer 119, and a charge-storage element, formed by a respective portion 115a, 115b of the nitride layer 111 above the semiconductor layer sub-region 107a, 107b with the interposition of the silicon dioxide layer 113. Charges can be injected and become trapped into either one or both of the nitride layer portions 115a, 115b, thereby affecting the formation of an inversion layer in the respective underlying subregion 107a, 107b of the semiconductor layer 103.

The central transistor T2, represented by the symbol of a normal MOSFET, has a gate formed by the polysilicon layer 119 and a gate dielectric formed by the superposition of the ONO stack 111 and the silicon dioxide film 1012.

The memory cell thus has two source/drain electrodes S/Da, S/Db, formed by the source/drain regions 109a and 109b, a control gate CG formed by the polysilicon layer 119, and two charge-storage elements CHSa and CHSb formed by the nitride layer portions 115a and 115b, respectively.

By applying suitable voltages to the control gate CG and to the source/drain electrodes S/Da, S/Db, electrons can be selectively injected into the charge storage elements CHSa, CHSb and become trapped therein. For example, in order to inject electrons into the charge storage element CHSa so as to write the left-hand lateral transistor T1 of the memory cell, the source/drain electrode S/Db opposite thereto (acting as a memory cell source electrode in the programming phase of the transistor T1) is kept to a reference voltage (ground), while sufficiently high positive voltages are applied to the source/drain electrode S/Da adjacent the charge storage element CHSa (the source/drain electrode S/Da acts as a memory cell drain electrode, or programming electrode, in the programming phase of the transistor T1) and to the control gate CG; for example, a voltage of approximately 5 V is applied to the source/drain electrode S/Da, while the control gate CG is raised to approximately 9 V. In this way, a current is made to flow from the source/drain electrode S/Da to the source/drain electrode S/Db; hot electrons in the memory cell channel are injected into the charge storage element CHSa.

Electrons can be removed from the charge storage element CHSa by applying a sufficiently high positive voltage (e.g., 8 V) to the adjacent source/drain electrode S/Da, while keeping the control gate CG grounded and leaving the opposite source/drain electrode S/Db floating. Alternatively, the control gate CG is biased to a negative voltage (e.g., −3 V) and the source/drain electrode S/Da is biased to a positive voltage (e.g., 5 V), while the opposite source/drain electrode S/Db is still left floating.

The programming state of the left-hand lateral transistor T1 can be sensed by keeping the adjacent source/drain electrode S/Da (acting as the memory cell source electrode in the reading phase of the transistor T1) at the reference voltage, while applying positive voltages (lower than those used for programming, for example 1 or 2 V and 5 V, respectively) to the opposite source/drain electrode S/Db (acting as the memory cell drain electrode in reading the transistor T1) and to the control gate CG.

Figure 2:
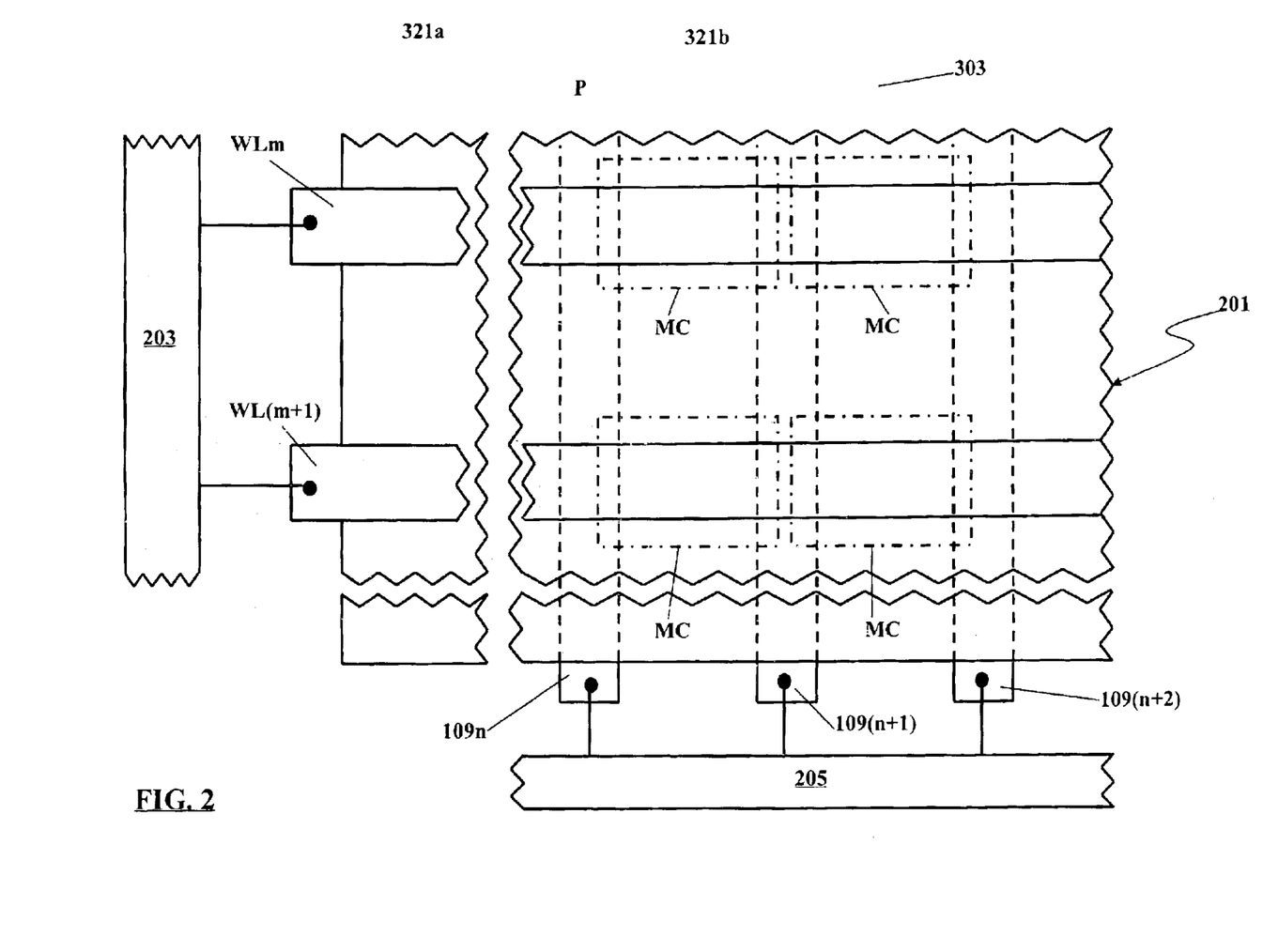
FIG. 2 is a schematic top-plan view of a portion of an array of dual charge-storage location memory cells according to an embodiment of the present invention.

In FIG. 2 a portion of an array 201 of dual charge-storage location memory cells MC of the type described above is schematically depicted in top-plan view.

The memory cells MC are conventionally arranged in rows and columns.

The memory cells MC in each row have the respective control gates CG connected to a same word line, such as the two word lines WLm, WL(m+1) shown in the drawing. The word lines are polysilicon strips extending across the array in a first direction; referring back to FIG. 1E and assuming that this drawing is a cross-section of a memory cell MC of the array 201, the polysilicon layer 119 is an array word line in cross-section. The word lines are driven by a per-se known word line selector 203.

The array 201 shown in FIG. 2 has the so-called contactless structure, in which no electrical contacts to the source/drain regions of the memory cells are provided within the array. Elongated doped semiconductor regions 109n, 109(n+1), 109(n+2) extends across the array transversally to the word lines and forms array bit lines. Referring back to FIG. 1E, and assuming again that this drawing shows a memory cell MC of the array 201, the source/drain regions 109a, 109b of the memory cell are two array bit lines in cross-section. Outside the array 201, the bit lines 109n, 109(n+1), 109(n+2) are contacted by metal lines driven by a per-se known column selector 205.

It is pointed out that, albeit the advantages that a contactless memory cell array allows achieving in terms of compactness, the memory cell according the above-described embodiment of the present invention can be used to build memory cell arrays of different structure, such as the traditional one with metal bit lines and contacts to the memory cells source/drain regions inside the array.

It can be appreciated that in the memory cell according to the above-described embodiment of the present invention, the dielectric layer that separates the nitride layer 115 from the underlying semiconductor layer region 107 (i.e., the memory cell channel region) does not have a uniform thickness, and has instead different thickness in different sub-regions of the channel region. In particular, the thickness of the dielectric layer is lower over the lateral sub-regions 107a, 107b of the memory cell channel region 107, near the source/drain regions 109a, 109b; the dielectric layer is thicker over the central sub-region 107c of the memory cell channel region 107.

This non-uniform thickness of the dielectric layer affects the vertical electric field along the memory cell's channel region. When either one of the two transistors T1, T2 is programmed or erased, the vertical electric field along the memory cell channel region is kept rather low, except in the sub-region 107a or 107b under the nitride layer portion 115a or 115b (the memory cell's charge storage element CHSa or CHSb) into or from which electrons are to be injected or extracted. The injection and the extraction of electrons into and from either one of the two charge storage elements CHSa, CHSb are consequently strongly localized.

In particular, the non-uniform thickness of the dielectric layer determines a vertical electric field distribution along the channel region that strongly disfavors the injection and trapping of electrons into the portion of the nitride layer 115 over the central sub-region 107c of the channel region 107, as well as any charge redistribution phenomenon.

In programming, the charges injected into and trapped in the nitride layer 115 are therefore strongly localized at the nitride layer portions 115a, 115b, adjacent the memory cell source/drain regions 109a, 109b, where they can be relatively easily removed during the erase operation.

The memory cell according to the above-described embodiment of the present invention is thus not subjected to a fast aging caused by the presence of charges trapped in central portion of the nitride layer, where they can hardly be removed. The memory cell can withstand a high number of program/erase cycles.

Similar considerations apply to electrons injected into the nitride layer 115 by the CHISEL effect.

Thanks to the localization of the injected charges in the two charge-storage locations of the memory cells, less charges need to be injected in order to achieve a target threshold voltage shift. This fact, in conjunction with the fact that the injected charges remain localized near the memory cell source/drain regions, improves the efficiency of the charge carrier recombination mechanism during the erase operation.

For the above reasons, the distributions of threshold voltage values are rather narrow: a lower threshold voltage shift is thus sufficient to guarantee the discrimination between an erased and a written bit. Thanks to this, small amount of charges need to be injected to achieve the desired threshold voltage shift, which reduces the memory cell aging.

Also, relatively low drain voltages are needed to program the memory cells, thus reducing the soft-erase effect induced on memory cells belonging to a same column of the array.

The strong localization of the charges in the two charge-storage elements strongly reduces the influence of the charges injected into one charge-storage element on the other one. The memory cell operating area, in terms of threshold voltage values, is consequently increased. In conjunction with the fact that even a small threshold voltage shift can be discriminated, this allows allocating more than two threshold voltage levels, thus making it possible to implement multi-level approaches.

The provision of a thinner dielectric layer near the source/drain regions also allows reducing the current that needs to be made to flow through the memory cell in the programming phase. A rather high current is normally needed to produce channel hot electrons of sufficiently high energy, capable of overcoming the potential barrier between the channel region and the charge storage elements. A lower dielectric thickness reduces the electric potential barrier that the electrons need to overcome to be injected into the charge storage elements; consequently, channel hot electrons of lower energy can overcome said potential barrier. A reduced programming current allows increasing the degree of parallelism of the memory in programming, and thus reduces the programming time.

The above considerations apply not only to a dual charge-storage location memory cell, but also to conventional one-bit or multi-level memory cells.

FIG. 3 shows in a simplified cross-sectional view an electrically-programmable memory cell according to another embodiment of the present invention. The memory cell comprises N-type source 309a and drain 309b regions formed in a P-type semiconductor layer 303. The source and drain regions 309a and 309b, respectively forming a source electrode S and a drain electrode D, are spaced apart and define a channel region 307 there between. A dielectric layer 321 is placed over the channel region 307. The dielectric layer 321, for example of silicon dioxide, comprises a first portion 321a and a second portion 321b, the second portion 321b being adjacent the drain region 309b and having a lower thickness than the first portion 321a. A conductive layer 323, for example of polysilicon, is placed over the dielectric layer 321. The conductive layer 323 forms a floating gate, and is separated by an overlying conductive layer 319 forming a control gate CG by an ONO stack 311.

The memory cell of FIG. 3 is programmed by applying sufficiently high positive potentials to the control gate CG and to the drain D (acting as a programming electrode), while keeping the source grounded. The provision of the dielectric portion 321b of reduced thickness near the drain electrode facilitates injection of channel hot electrons into the floating gate, thereby allowing to reduce the programming current. The programming current is also expected to be further reduced due to the contribution of an electron tunnelling mechanism, consequence of the reduced thickness of the dielectric portion 321b.

The memory cell of FIG. 3 can be fabricated by a process providing for selectively etching the dielectric layer 321 to reduce the thickness thereof in the portion 321b.

In an alternative embodiment, suitable for electrically-erasable memory cells such as Flash EPROMs, the dielectric layer 321 may also include a second portion of reduced thickness near the source region 309a. This allows extracting charges from the floating gate by means of a Fowler-Nordheim tunnelling mechanism at the memory cell source S. This memory cell can be fabricated by a process similar to the one previously described.

Although the present invention has been disclosed and described by way of some embodiments, it is apparent to those skilled in the art that several modifications to the described embodiments, as well as other embodiments of the present invention.

In particular, the fabrication process previously described merely exemplifies an embodiment, albeit preferred, of the invention. Alternative ways of forming a silicon dioxide layer having differentiated thickness can be envisaged. For example, instead of forming the silicon dioxide film 1012 by means of an isotropic etch of an initially thicker and more extended silicon dioxide layer, a selective silicon dioxide growth over the central portion 107c of the channel regions can be carried out. However, it is worth noting that the process previously described allows forming a symmetric structure.

Also, although in the present description reference has always been made to ONO stack of layers, this is not to be considered a limitation for the present invention. Other types of materials may in fact be used. For example, the silicon nitride layer may be substituted for by a different charge-trapping dielectric material. Also, one or both of the silicon dioxide layers forming the bottom and top layers of the ONO stack of layers may be substituted for by different dielectrics, particularly high-k (i.e., high dielectric constant) dielectrics such as the promising $ZrO_2$ and $HfO_2$.

The present invention can be applied in general to the fabrication of any type of electrically modifiable non-volatile memory programmable by hot-electron injection, such as the EPROMs and the Flash EPROMs.

Other modifications and embodiments of the present invention are possible, without departing from the scope thereof.

What is claimed is:

1. An electrically-programmable memory cell programmed by means of injection of channel hot electrons into a charge-storage element capacitively coupled to a memory cell channel for modulating a conductivity thereof depending on a stored amount of charge, comprising:

a first and a second spaced-apart electrode regions formed in a semiconductor layer and defining a channel region there between, at least one of the first and second electrode regions acting as a programming electrode of the memory cell;

a control electrode capacitively coupled to the charge-storage element, the charge-storage element being placed over the channel to substantially extend from the first to the second electrode regions, and being separated from the channel region by a dielectric layer, the dielectric layer having a reduced thickness in a portion thereof near the at least one programming electrode and over the channel region.

2. The memory cell according to claim 1, in which the charge-storage element comprises a charge-trapping layer having a first and a second charge-storage locations near the first and second electrode regions, respectively, the first and second electrode regions alternatively acting as programming electrodes, the dielectric layer having a lower thickness near the first and second electrode regions and a greater thickness over a central portion of the channel region.

3. The memory cell according to claim 2, in which the dielectric layer comprises a first dielectric layer placed over the central portion of the channel region, and a second dielectric layer placed over the whole channel region, the second dielectric layer being superimposed on the first dielectric layer over the central portion of the channel region.

4. The memory cell according to claim 3, in which the first dielectric layer is a layer of silicon dioxide.

5. The memory cell according to claim 3, in which the second dielectric layer is a layer of silicon dioxide.

6. The memory cell according to claim 1, in which the charge-trapping layer is a layer of silicon nitride.

7. The memory cell according to claim 1, in which the charge-storage element is a conductive layer, particularly a polysilicon layer.

8. A nonvolatile memory cell, comprising:

first and second source/drain regions;

a bulk region disposed between the first and second source/drain regions and having a first portion contiguous with the first source/drain region and having a second portion contiguous with the first portion;

an insulator disposed on the bulk region, the insulator being thinner over the first portion of the bulk region and being thicker over the second portion of the of the bulk region; and a charge-trapping layer disposed on the insulator.

9. The nonvolatile memory cell of claim 8 wherein the second portion of the bulk region is contiguous with the second source/drain region.

10. The nonvolatile memory cell of claim 14 wherein:

the bulk region comprises a third portion that is contiguous with the second portion and the second source/drain region; and the insulator is thinner over the third portion of the bulk region than it is over the second portion.

11. The nonvolatile memory cell of claim 8 wherein the charge-trapping layer comprises polysilicon.

12. The nonvolatile memory cell of claim 8 wherein the charge-trapping layer chargeable and dischargeable through the thin portion of the insulator.

13. The nonvolatile memory cell of claim 8 wherein:

the first source/drain region is operable as a drain; and the second source/drain region is operable as a source.

14. A nonvolatile memory cell, comprising:

first and second source/drain regions;

a bulk region disposed between the first and second source/drain regions and having first and second end portions respectively contiguous to the first and second source/drain regions and having a center portion disposed between the end portions;

an insulator disposed on bulk region, the insulator being thinner over the first and second end portions of the bulk region and being thicker over the center portion of the of the bulk region; and a charge-trapping layer disposed on the insulator.

15. The nonvolatile memory cell of claim 14 wherein:

the first and second source/drain regions comprise N-doped silicon; and the bulk region comprises P-doped silicon.

16. The nonvolatile memory cell of claim 14 wherein:

the bulk region composes a portion of a P-doped substrate; and the first and second source/drain regions are N-doped and are disposed in the substrate.

17. The nonvolatile memory cell of claim 14 wherein:

the bulk region composes a portion of a P-doped well that is disposed in an N-doped substrate; and the first and second source/drain regions are N-doped and are disposed in the well.

18. The nonvolatile memory cell of claim 14 wherein the insulator comprises:

a first insulator layer disposed only on the center portion of the bulk region: and a second insulator layer disposed on the first insulator layer and on the first and second end portions of the bulk region.

19. The nonvolatile memory cell of claim 14 wherein the insulator comprises silicon dioxide; and the charge-trapping layer comprises silicon nitride.

20. The nonvolatile memory cell of claim 14 wherein the charge-trapping layer comprises a first portion disposed over the first end portion of the bulk region and a second portion disposed over the second end portion of the bulk region, the first portion programmable with a first level of charge and the second portion programmable independently of the first portion with a second level of charge.

21. The nonvolatile memory cell of claim 14 wherein the charge-trapping layer is continuous over the center portion and end portions of the bulk region.

22. The nonvolatile memory cell of claim 14 wherein the insulator and charge-trapping layers are disposed on the first and second source/drain regions.

23. An electrically-programmable memory cell, comprising:

first and second electrode regions formed in a semiconductor layer and defining a channel region therebetween, at least one of the first and second electrode regions acting as a programming electrode of the memory cell; and a control electrode capacitively coupled to a charge-storage element, the charge-storage element being placed over, the channel to substantially extend from the first to the second electrode regions, the charge-storage element being separated from the channel region by a dielectric layer, wherein the dielectric layer has a reduced thickness in a portion thereof over the channel region.

* * * * *

UNITED STATES PATENT AND TRADEMARK OFFICE
CERTIFICATE OF CORRECTION

PATENT NO. : 6,882,001 B2
DATED : April 19, 2005
INVENTOR(S) : Luigi Pascucci

It is certified that error appears in the above-identified patent and that said Letters Patent is hereby corrected as shown below:

Column 11,
Line 12, please delete the duplicate words "of the" before "bulk".

Column 12,
Line 27, please delete the "," after "placed over" and before "the".

Signed and Sealed this

Twelfth Day of July, 2005

JON W. DUDAS
*Director of the United States Patent and Trademark Office*